US006529015B2

(12) United States Patent
Nonoyama et al.

(10) Patent No.: US 6,529,015 B2
(45) Date of Patent: Mar. 4, 2003

(54) SIGNAL PROCESSING APPARATUS (75) Inventors: Shigeru Nonoyama, Aichi-ken (JP); Hiroaki Itou, Kariya (JP)

(73) Assignee: Denso Corporation, Kariya (JP)

( * ) Notice: Subject to any disclaimer, the term of this patent is extended or adjusted under 35 U.S.C. 154(b) by 42 days.

(21) Appl. No.: 09/788,539

(22) Filed: Feb. 21, 2001

(65) Prior Publication Data

US 2001/0019273 A1 Sep. 6, 2001

(30) Foreign Application Priority Data

Mar. 2, 2000 (JP) .................................. 2000-061884

(51) Int. Cl.$^7$ ............................................. G01R 27/26
(52) U.S. Cl. ....................................................... 324/678
(58) Field of Search ................................ 324/658, 661, 324/665, 672, 676, 677, 678; 73/514.32

(56) References Cited

U.S. PATENT DOCUMENTS

| | | | | |
|---|---|---|---|---|
| 4,187,459 A | * | 2/1980 | Wolfendale | ................ 324/60 C |
| 4,404,481 A | * | 9/1983 | Ide et al. | ..................... 307/491 |
| 4,634,965 A | * | 1/1987 | Foote | ........................ 324/60 C |
| 5,028,876 A | * | 7/1991 | Cadwell | ..................... 324/678 |
| 5,189,376 A | * | 2/1993 | Roberge et al. | ............. 324/662 |
| 5,506,454 A | | 4/1996 | Hanzawa et al. | |
| 5,540,095 A | | 7/1996 | Sherman et al. | |
| 5,583,290 A | | 12/1996 | Lewis | |
| 5,633,594 A | | 5/1997 | Okada | |
| 5,646,539 A | * | 7/1997 | Codina et al. | ............... 324/678 |
| 5,661,240 A | * | 8/1997 | Kemp | ..................... 73/514.32 |
| 5,751,154 A | * | 5/1998 | Tsugai | ........................ 324/661 |
| 5,777,482 A | * | 7/1998 | Tielert et al. | ................ 324/678 |
| 6,194,903 B1 | * | 2/2001 | Schultz | ....................... 324/661 |
| 6,316,948 B1 | * | 11/2001 | Briefer | ........................ 324/678 |
| 6,366,099 B1 | * | 4/2002 | Reddi | .......................... 324/678 |

FOREIGN PATENT DOCUMENTS

| | | |
|---|---|---|
| JP | 7-243863 | 9/1995 |
| JP | 8-145717 | 6/1996 |
| JP | 8-297147 | 11/1996 |
| JP | 9-72757 | 3/1997 |

* cited by examiner

Primary Examiner—N. Le
Assistant Examiner—Etienne P LeRoux
(74) Attorney, Agent, or Firm—Law Offices of David G. Posz (57) ABSTRACT

A capacity(ies) of a variable capacitor(s) varies with a physical amount. A C-V conversion circuit converts variation in the capacity into a voltage signal. First and second charge holding circuits hold the voltage signal at different timings as first and second charges, respectively. An offset compensating charge holding circuit generates and holds an offset charge for compensation of an offset in the voltage signal. A charge combining and holding circuit combines and holds the first and second charges and the offset charge. An outputting circuit receives the combined charge from the charge combining and holding circuit and outputs an output voltage signal corresponding to the physical amount in accordance with the received charge. The outputting circuit, the offset compensating charge holding circuit, the C=V circuit may be omitted. The variable capacitance may include a capacitor or a differential type capacitors.

80 Claims, 6 Drawing Sheets

SIGNAL PROCESSING APPARATUS

BACKGROUND OF THE INVENTION

1. Field of the Invention

This invention relates to a signal processing apparatus for detecting a variation in a capacitance or amplifying or filtering a signal.

2. Description of the Prior Art

A signal processing circuit for detecting a variation in capacitance is known. Japanese patent application provisional publication No. 8-145717 discloses a capacitance variation detection circuit as the signal processing circuit. In this circuit, carriers are supplied to two sensor capacitors. The charges in two sensor capacitors are supplied to a C-V converter. An output signal of the C-V converter is amplified by a gain amplifier and sampled and held by two sampling hold circuits in phase with carriers, respectively. A differential amplifier outputs a difference between sampled voltages as a voltage signal corresponding to the physical amount.

If there is a considerable unbalance between sensor capacitances, the output of the C-V converter includes a considerable offset. In this circuit, the output signal of the C-V circuit is processed with voltage signals, so that the output of the gain amplifier may saturate at a high gain.

SUMMARY OF THE INVENTION

The aim of the present invention is to provide a superior signal processing apparatus.

According to the present invention, a first aspect of the present invention provides a signal processing apparatus comprising: variable capacitor means of which capacity varies with a physical amount; a C-V conversion circuit for converting variation in said capacity into a voltage signal; first and second charge holding means for holding said voltage signal at different timings as first and second charges, respectively; offset compensating charge holding means for generating and holding an offset charge for compensation of an offset in said voltage signal; charge combining and holding means for combining and holding said first and second charges and said offset charge; and outputting means for receiving the combined charge from said charge combining and holding means and outputting an output voltage signal corresponding to said physical amount in accordance with the received charge. Thus, the signal processing is performed with charge signals. Thus, if there is a considerable offset in the variable capacitors, it can be effectively removed and a high gain amplifying is provided.

According to the present invention, a second aspect of the present invention provides a signal processing apparatus comprising: variable capacitor means of which capacity varies with a physical amount; a C-V conversion circuit for converting variation in said capacity into a voltage signal; first and second charge holding means for holding said voltage signal at different timings as first and second charges, respectively; offset compensating charge holding means for generating holding an offset charge for compensation of an offset in said voltage signal; and charge combining and holding means for combining and holding said first and second charges and said offset charge as the combined charge and converting the combined charge into an output voltage signal indicative of said physical amount.

According to the present invention, a third aspect of the present invention provides a signal processing apparatus based on the first and second aspects, further comprising charge transferring means for transferring said first and second charges and said offset charge to said charge combining and holding means at the same time.

According to the present invention, a fourth aspect of the present invention provides a signal processing apparatus based on the first and second aspects, wherein said first charge holding means holds said voltage signal as said first charge corresponding to an offset voltage of said C-V conversion circuit, said second charge holding means holds said voltage signal as said second charge representing variation in said capacity, and said charge combining and holding means holds said combined charge derived by subtracting said first charge and said offset charge from said second charge. Thus, offsets developed in the variable capacitor means and the C-V converter can be removed in the output signal.

According to the present invention, a fifth aspect of the present invention provides a signal processing apparatus comprising: variable capacitor means of which capacity varies with a physical amount; a C-V conversion circuit for converting variation in said capacity into a voltage signal; first and second charge holding means for holding said voltage signal at different timings as first and second charges, respectively; charge combining and holding means for combining and holding said first and second charges; and outputting means for receiving the combined charge and outputting an output voltage signal in accordance with the received charge corresponding to said physical amount. This circuit is useful (low cost) if there is no offset in the variable capacitance.

According to the present invention, a sixth aspect of the present invention provides a signal processing apparatus comprising: variable capacitor means of which capacity varies with a physical amount; a C-V conversion circuit for converting variation in said capacity into a voltage signal; first and second charge holding means for holding said voltage signal at different timings as first and second charges, respectively; and charge combining and holding means for combining and holding said first and second charges and converting a combined charge into an output voltage signal corresponding to said physical amount.

According to the present invention, a seventh aspect of the present invention provides a signal processing apparatus based on the fifth and sixth aspects, further comprising charge transferring means for transferring said first and second charges to said converting means at the same time.

According to the present invention, an eighth aspect of the present invention provides a signal processing apparatus based on the fifth and sixth aspects, wherein said first charge holding means holds said voltage signal as said first charge corresponding to an offset voltage of said C-V conversion circuit, said second charge holding means holds said voltage signal as said second charge representing variation in said capacity, and said charge combining and holding means holds said combined charge derived by subtracting first charge from said second charge.

According to the present invention, a ninth aspect of the present invention provides a signal processing apparatus based on the first and fifth aspects, wherein each of said first and second charge holding means comprises at least a first capacitor and first switching means for charging and discharging said first capacitor, said charge combining and holding means comprises a second capacitor for holding the combined charge, second switching means for charging and discharging the combined charge, and a first operational amplifier for converting said combined charge into said voltage signal, and said outputting means includes a third capacitor for receiving and holding the combined charge from said second capacitor and a second operational amplifier for converting the received charge from said third capacitor into said output voltage signal.

According to the present invention, a tenth aspect of the present invention provides a signal processing apparatus based on the ninth aspects, wherein said second switching means switches between first and second states, in said first state, said second capacitor is connected between an output and a non-inverted input of said first operational amplifier, and in said second state, said second capacitor is connected in parallel to said third capacitor.

According to the present invention, an eleventh aspect of the present invention provides a signal processing apparatus based on the first, second, and sixth aspects, wherein each of said first and second charge holding means comprises at least a first capacitor and switching means for charging and discharging said first capacitor and said charge combining and holding means comprises a second capacitor for holding the combined charge, switching means for charging and discharging the combined charge, and an operational amplifier for converting said combined charge into said output voltage signal.

According to the present invention, a twelfth aspect of the present invention provides a signal processing apparatus based on the ninth and eleventh aspects, wherein a capacitance of said first capacitor is greater than a capacitance of said second capacitor. Thus, amplification is provided in accordance with a ratio of these capacities.

According to the present invention, a thirteenth aspect of the present invention provides a signal processing apparatus based on the first, fifth, ninth, and eleventh aspects, wherein said charge combining and holding means and said outputting means form a low-pass filter.

According to the present invention, a fourteenth aspect of the present invention provides a signal processing apparatus based on the second, sixth, and eleventh aspects, wherein said charge combining and holding means and said outputting means form a low-pass filter.

According to the present invention, a fifteenth aspect of the present invention provides a signal processing apparatus based on the first, second, fifth, and sixth aspects, wherein said variable capacitor means comprises a differential variable capacitor unit including substantially equivalent capacitors connected in series.

According to the present invention, a sixteenth aspect of the present invention provides a signal processing apparatus based on the first, second, fifth, and sixth aspects, wherein said C-V conversion circuit comprises a switched capacitor circuit.

According to the present invention, a seventeenth aspect of the present invention provides a signal processing apparatus based on the first, second, fifth, and sixth aspects, further comprising a control circuit for generating a carrier signal supplied to said variable capacitor means to output said voltage signal from said C-V conversion circuit and generating control signals supplied to said first and second charge holding means, said offset compensating charge holding means, and said charge combining and holding means.

According to the present invention, an eighteenth aspect of the present invention provides a signal processing apparatus comprising: first and second charge holding means for holding an input signal as first and second charges at different timings, respectively; offset compensating charge holding means for generating and holding an offset charge; charge combining and holding means for combining and holding said first and second charges and said offset charge; and outputting means for receiving the combined charge and outputting a voltage corresponding to said input signal in accordance with the received charge.

According to the present invention, a nineteenth aspect of the present invention provides a signal processing apparatus signal processing apparatus comprising: first and second charge holding means for holding an input signal at different timings as first and second charges, respectively; offset compensating charge holding means for generating and holding an offset charge; and charge combining and holding means for combining and holding said first and second charges and said offset charge as a combined charge and converting said combined charge into an output voltage corresponding to said input signal.

According to the present invention, a twentieth aspect of the present invention provides a signal processing apparatus comprising: first and second charge holding means for holding an input signal as first and second charges at different timings, respectively; charge combining and holding means for combining and holding said first and second charges; and outputting means for receiving the combined charge and outputting a voltage corresponding to said input signal in accordance with the received charge.

According to the present invention, a twenty-first aspect of the present invention provides a signal processing apparatus comprising: first and second charge holding means for holding an input signal at different timings as first and second charges, respectively; and charge combining and holding means for combining and holding said first and second charges and said offset charge as a combined charge, wherein said charge combining and holding means converts said combined charge into an output voltage corresponding to said input signal.

According to the present invention, a twenty-second aspect of the present invention provides a signal processing apparatus based on nineteenth, twentieth, and twenty-first aspects, wherein said input signal is subjected to amplitude modulation at a predetermined frequency and said first and second charge holding means, said offset compensating charge holding means, and said charge combining and holding means operate at said predetermined frequency.

According to the present invention, a twenty-third aspect of the present invention provides a signal processing apparatus comprising: variable capacitor means of which capacity varies with a physical amount; a C-V conversion circuit for converting variation in said capacity into a voltage signal; at least a charge holding means for holding said voltage signal as a charge; offset compensating charge holding means for generating and holding an offset charge for compensation of an offset in said voltage signal; outputting means for combining and converting said charge and said offset charge to output a voltage signal corresponding to said physical amount.

According to the present invention, a twenty-fourth aspect of the present invention provides a signal processing apparatus comprising: at least a charge holding means for holding an input voltage signal as a charge, said input voltage signal being modulated at a predetermined frequency; offset compensating charge holding means for generating and holding an offset charge for compensation of an offset in said voltage signal; outputting means for combining and converting said charge and said offset charge to output a voltage signal corresponding to said input voltage signal.

According to the present invention, a twenty-fifth aspect of the present invention provides a signal processing apparatus based on the twenty-third and twenty-fourth aspects wherein said outputting means comprises: charge combining and holding means for combining and holding said charge and said offset charge; and converting and outputting means for receiving and converting a combined charge from said charge combining and holding means into said output voltage signal.

According to the present invention, a twenty-sixth aspect of the present invention provides a signal processing apparatus based on the twenty-third and twenty-fourth aspects wherein said outputting means comprises charge combining and holding means for combining and holding said charge and said offset charge and converting the combined charge into said output voltage signal.

According to the present invention, a twenty-seventh aspect of the present invention provides a signal processing apparatus based on the first, second, eighteenth, and nineteenth aspects wherein said offset compensating charge holding means includes a memory for storing digital data corresponding to said offset, and a d/a converter for d/a-converting said digital data to generate said offset charge.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

<First Embodiment>

Figure 1:
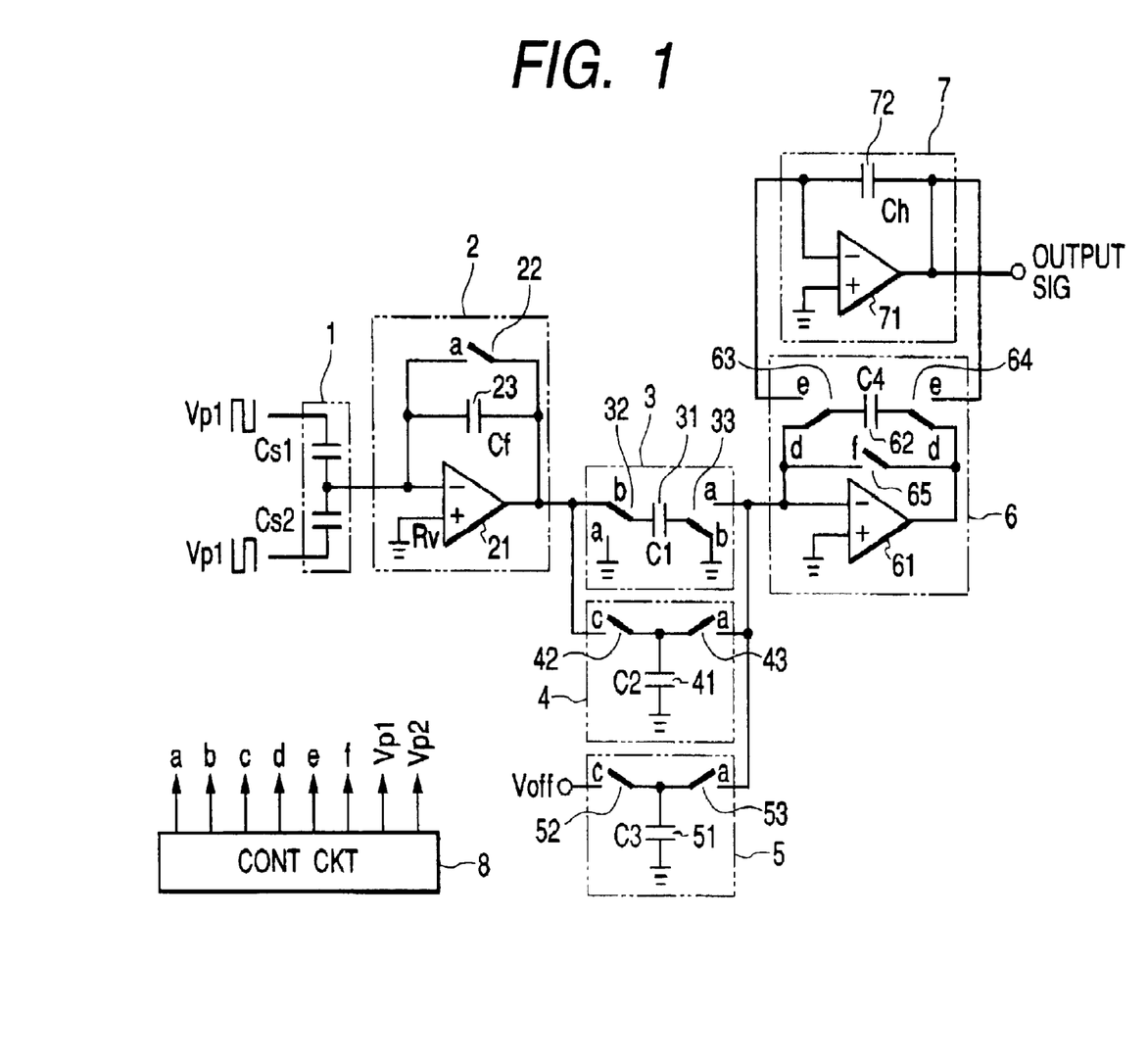
FIG. 1 is a schematic circuit diagram of a signal processing apparatus according to a first embodiment.
Figure 2:
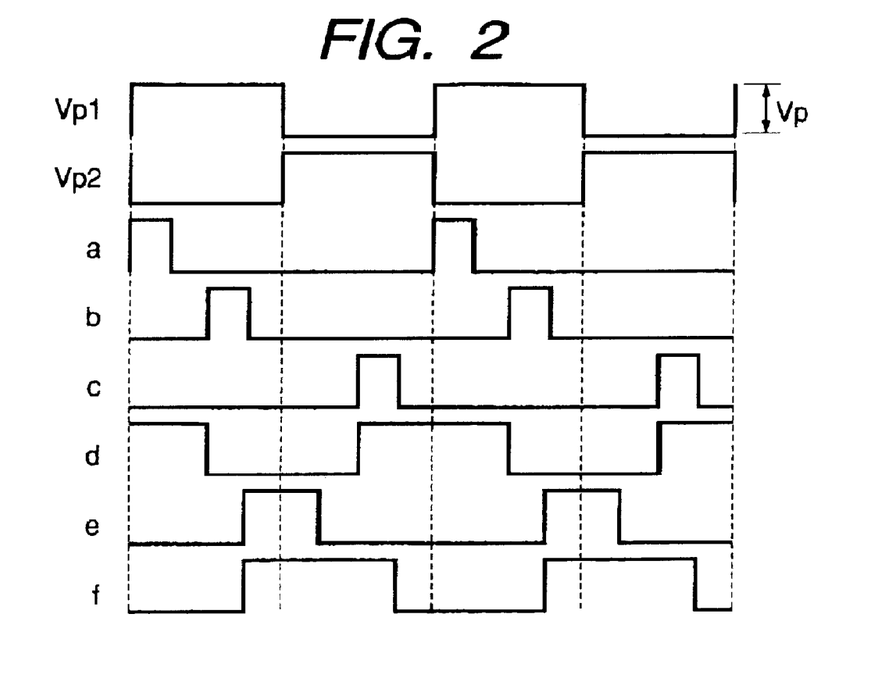
FIG. 2 depicts a timing chart showing the operation in the signal processing apparatus shown in FIG. 1.

FIG. 1 shows a signal processing apparatus according to a first embodiment of the present invention. FIG. 2 depicts a timing chart showing the operation in the signal processing apparatus.

The signal processing apparatus according to the first embodiment is provided as a capacity variation detection apparatus including a differential variable capacitor unit 1, a C-V converting circuit 2, first and second charge holding circuits 3 and 4, an offset adjusting charge holding circuit 5, a combined charge holding circuit 6, an output circuit 7, and a control circuit 8 to detect capacity variation of the differential variable capacitor unit 1.

The differential variable capacity unit 1 includes capacitors $Cs1$ and $Cs2$ connected in series between carriers $Vp1$ and $Vp2$ from the control circuit 8. The carriers have an anti-phase relation with each other. Capacities of the differential variable capacity unit 1 vary with a physical amount, for example, acceleration or a pressure.

The C-V converting circuit 2 is formed as a switched capacitor circuit to convert a charge corresponding to a difference between the capacities (of $Cs1$ and $Cs2$) in the differential variable capacity unit 1 generated with phase inversion in the carriers. In the C-V converting circuit 2, the intermediate terminal (tap) of the difference variable capacity unit 1 is connected to an inverting input terminal of the operational amplifier 21 and the non-inverting input terminal of the operational amplifier 21 is supplied with a reference voltage RV (for example, 2.5 V or the ground potential). Moreover, a switch 22 and a capacitor (Cf) 23 are connected between the inverting input terminal and the output terminal of the operational amplifier 21 in parallel.

The first charge holding circuit 3 includes a capacitor (C1) 31, switch 32 for switching connection of one electrode (input side) of the capacitor C1 to either output of the operational amplifier 21 or the ground, and a switch 33 for switching connection of the other electrode (output side) of the capacitor C1 to either output of the C-V converting circuit 2 or the ground. The first charge holding circuit 3 holds an offset voltage of the operational amplifier 21 in the C-V converting circuit 2 in the capacitor 31 by turning on and off of the switches 32 and 33 in response to the control signals a and b from the control circuit 8.

The second charge holding circuit 4 includes a capacitor (C2) 41, a switch 42 responsive to a control signal c for switchably connecting the output of the operational amplifier 21 to one electrode of the capacitor C2 (the other electrode of the capacitor C2 is grounded) and a switch 43 responsive to the control signal a for switchably connecting one electrode of the capacitor C2 to the output of the second charge holding circuit 4. The second charge holding circuit 4 holds a voltage derived by converting the capacity variation in the differential variable capacity unit 1 by the C-V conversion circuit 2, in the capacitor 41 by turning on and off of the switches 42 and 43 in response to the control signals c and a from the control circuit 8.

The offset adjusting charge holding circuit 5 includes a capacitor (C3) 51, a switch 52 responsive to the control signal c for supplying an offset voltage Voff to one electrode of the capacitor C3 (the other electrode of the capacitor C3 is grounded) in response to the control signal c, and a switch 53 for switchably connecting one electrode of the capacitor C3 to the output of the offset adjusting charge holding circuit 5. The offset adjusting charge holding circuit 5 holds a charge generated from the offset voltage Voff in the capacitor 51 by turning on and off of the switches 52 and 53 in response to the control signals c and a from the control circuit 8.

Figure 3:
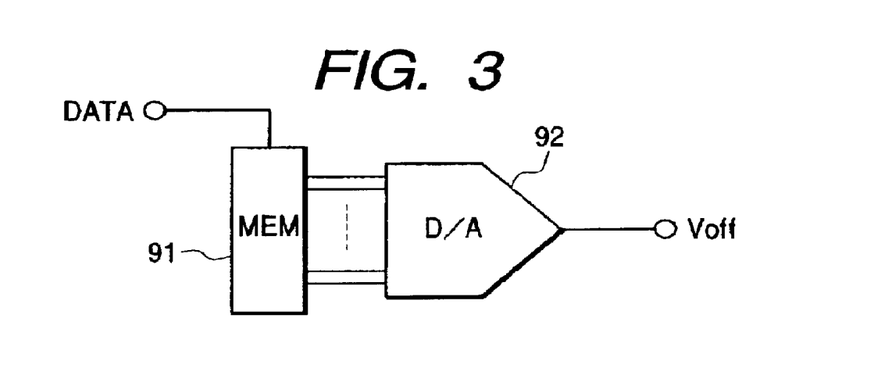
FIG. 3 is a schematic circuit diagram of a variable voltage source used in the first to fourth embodiments.
Figure 4:
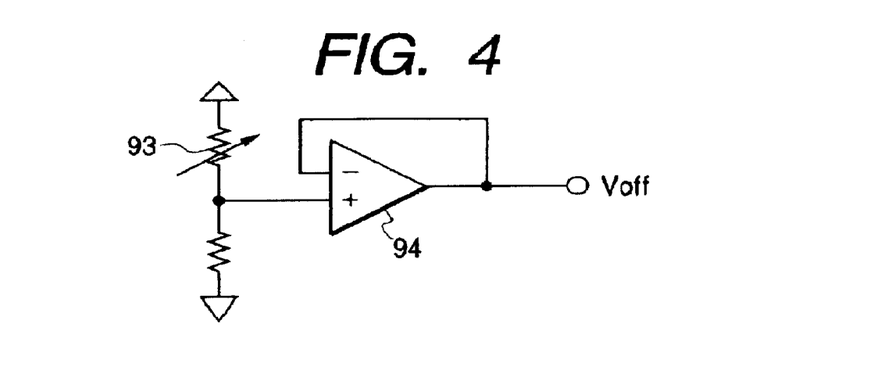
FIG. 4 is a schematic circuit diagram of another variable voltage source used in the first to fourth embodiments.

The offset voltage Voff may be generated by a variable voltage source. Moreover, the offset voltage may be generated as shown in FIG. 3. This circuit includes a memory 91 and a d/a converter 92. A digital value (data) corresponding to the offset voltage Voff is stored in the memory 91. The read data is converted by the d/a converter 92 to output the offset voltage Voff. Further, the offset voltage Voff may be generated by a circuit including a trimming resistor 93 and an impedance converting element 94 such as an operational amplifier. Trimming the trimming resistor 93 adjusts the voltage of the offset voltage Voff.

The combined charge holding circuit 6 includes an operational amplifier 61, a capacitor (C4) 62, switches 63 to 65 and holds charges sent from the capacitors 31, 41, and 51 at the same time in the capacitor 62. In this operation, the charges from the capacitors 31, 41, and 51 are supplied to the capacitor 62 such that the charges in the capacitors 31 and 51 are subtracted from the charge in the capacitor 41. The capacitor 62 holds the resultant charge, i.e., the combined charge or the different charge.

The output circuit 7 includes an operational amplifier 71 and a capacitor (Ch) 72. The charge in the capacitor 62 is distributed to the capacitor 72. The distributed charge is converted into an output voltage.

The control circuit 8 generates the carriers Vp1 and Vp2, the control signals a to f for controlling the switches 22, 32, 33, 42, 43, 52, 53, and 63 to 65 synchronized with the carriers Vp1 and Vp2, as shown in FIG. 2.

The switches 22, 32, 33, 42, 43, 52, 53, and 63 to 65 include switching elements formed with semiconductor elements and turn on when the control signals are H levels, respectively, and turn off when the control signals are L levels, respectively. The references a to f suffixed to respective switches in the drawings indicate that the switches operate in response to the control signals a to f, respectively. The switches 32 and 33 become open when the control signals a and b are not outputted, respectively. Similarly, the switches 63 and 64 become open when the control signals e and d are not outputted, respectively.

In operation, the carriers Vp1 and Vp2 having the antiphase relation are supplied to the variable capacity unit 1. When the control signal a goes to H, while the carrier Vp1 is H, the switch 22 in the C-V converting circuit 2 temporarily turns on. In this condition, the C-V converting circuit 2 acts as a voltage follower circuit and thus, the charge in the capacitor 23 is discharged and a potential at the intermediate tap of the variable capacity unit 1 is equalized to the reference voltage RV.

Then, the switch 22 is opened but the potential at the intermediate tap of the variable capacity unit 1 is maintained at the same potential as the reference voltage RV by the operation of the operational amplifier 21 and thus, an offset voltage V1 of the operational amplifier 21 is outputted by the C-V converting circuit 2. Next, the control signal b goes to H, the capacitor 31 in the first charge holding circuit 3 is charged with the offset voltage V1. The charge Q1 charged in the capacitor 31 is given by:

$$Q1 = C1 \cdot V1 \quad (1)$$

Next, the carriers Vp1 and Vp2 are inverted, thereby the C-V converting circuit 2 outputting a voltage V2 according to the difference between the capacities in the variable capacity unit 1 and the amplitude Vp of the carriers Vp1 an Vp2. The voltage V2 is represented by:

$$V2 = Vp \cdot (Cs1 - Cs2)/Cf \quad (2)$$

Next, when the control signal c goes to H, the capacitor 41 in the second charge holding circuit 4 is charged with the voltage V2. The charge charged in the capacitor 41 is given by:

$$Q2 = C2 \cdot V2 \quad (3)$$

At the same time, the capacitor 51 in the offset adjusting charge holding circuit 5 is charged with the offset voltage Voff. The charge Q3 charged in the capacitor 51 is represented by:

$$Q3 = C3 \cdot \text{Voff} \quad (4)$$

Next, when the control signal a goes to H, the charges stored in the capacitors 31, 41, and 51 are sent to the capacitor 62 in the combined charge holding circuit 6. In this operation, interconnections in the first and second charge holding circuits 3 and 4, and the offset charge holding circuit 5 are provided such that difference in charges between the capacitor 31 and the capacitors 41 and 51 is supplied to the capacitor C4 in the combined charge holding circuit 6. The charge Q4 stored in the capacitor C4 is given by:

$$Q4 = (Q1 - Q2) - Q3 = C1 \cdot V1 - C2 \cdot V2 - C3 \cdot \text{Voff} \quad (5)$$

That is, the difference between Q1 and Q2 is provided and the difference between the result and the Q3 is further provided.

Then, the output voltage V4 of the operational amplifier 61 in the combined charge holding circuit 6 is given by:

$$V4 = Q4/C4 = (C1 \cdot V1 - C2 \cdot V2 - C3 \cdot \text{Voff})/C4 \quad (6)$$

Here, assuming C1=C2=C3=C and V1−V2=ΔV, the voltage V4 is represented by:

$$V4 = (\Delta V - \text{Voff}) \cdot C/C4 \quad (7)$$

As shown in EQ. 6, the voltage V4 is provided by C/C4 times the voltage derived by subtracting the offset voltage Voff from the output voltage ΔV of the C-V converting circuit 2.

That is, Q2=C2·V2 includes the charge corresponding to the offset voltage of the operational amplifier 21 and Q1 corresponds to the offset voltage V1 of the operational amplifier 21, so that the charge of the offset voltage is cancelled in C··V. However, the offset due to unbalance in the variable capacities Cs1 and Cs2 remains in C·ΔV. Then, the offset charge due to unbalance in the variable capacities Cs1 and Cs2 is cancelled by C·Voff.

The charge stored in the capacitor 62 is distributed to the capacitor 72 of the outputting circuit 7, so that the voltage V4 is sent to the outputting circuit 7. Distributing the charge from the capacitor 62 to the capacitor 72 provides a first order of low-pass filter effect. The cutoff frequency is determined by a ratio between the capacitance Ch of the capacitor 72 and the capacitance C4 of the capacitor 62 and switching frequencies of switches 63 and 64.

As mentioned above, the output voltage of the C-V converting circuit 2 is held as charges and the offset voltages are cancelled with charges and the signal component is amplified by a ratio of capacitances, so that the signal component including no offset components can be amplified.

If the output voltage is directly amplified without cancelling the offset components, there is the possibility that the output of the outputting circuit saturates. However, according to this embodiment, though the offset is large, the offset can be cancelled, so that the dynamic range of the signal processing circuit is improved. That is, the input signal (charge) can be amplified up to the upper limitation of the dynamic range of the signal processing circuit.

Moreover, in the above mentioned signal processing circuit, the combined charge holding circuit 6 and the outputting circuit 7 are separated with each other with the switches 63 and 64, so that error in charge in operational amplifier 71 in the outputting circuit 7 can be eliminated, thereby high accuracy in amplifying can be provided.

Setting the offset voltage Voff is provides as follows:
In the static condition such that the variable capacity 1 does not change in response to outer factor (a physical amount such as acceleration), the carriers Vp1 and Vp2 are applied. The offset voltage Voff is determined such that the output of the outputting circuit 7 becomes zero volts.

<Second Embodiment>

Figure 5:
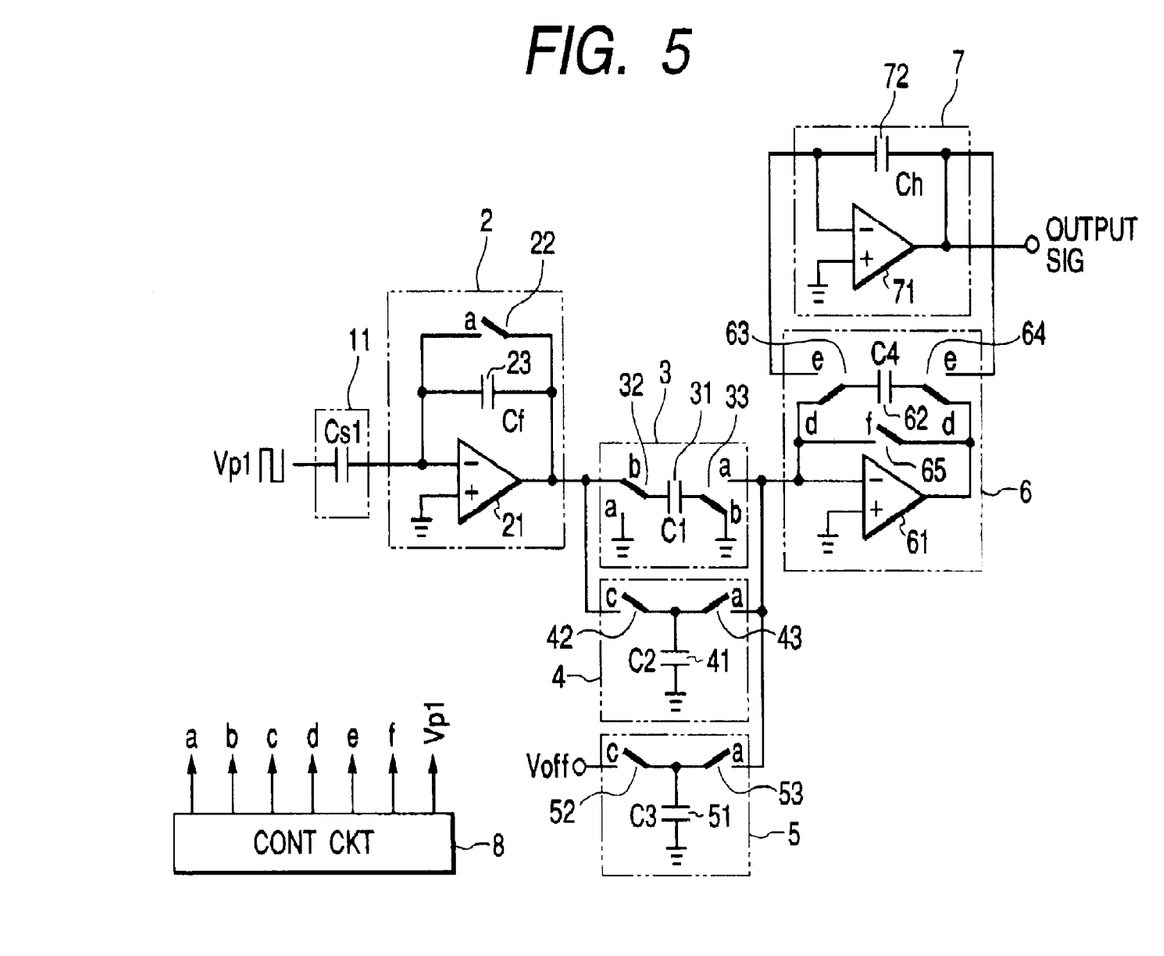
FIG. 5 is a schematic circuit diagram of a signal processing apparatus according to a third embodiment.
Figure 6:
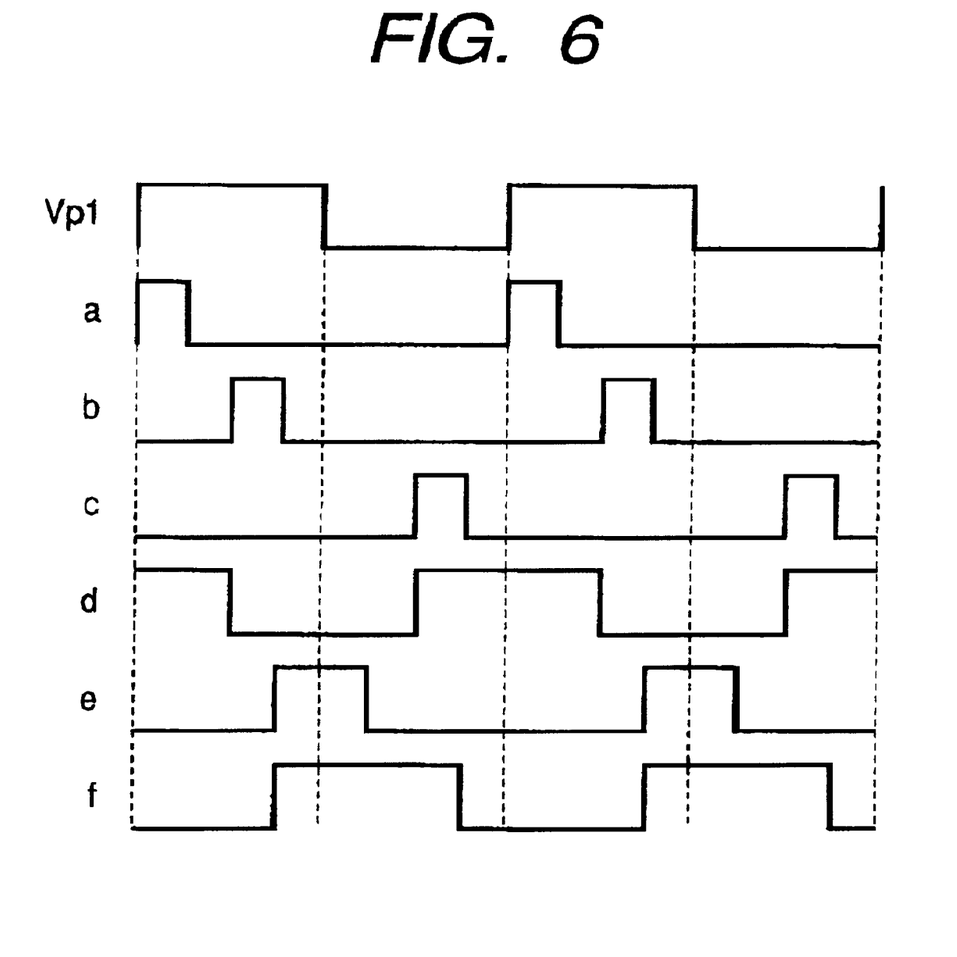
FIG. 6 depicts a timing chart showing the operation in the signal processing apparatus shown in FIG. 5.

FIG. 5 shows a signal processing apparatus according to a second embodiment and FIG. 6 shows a timing chart of the signal processing apparatus according to the second embodiment.

The signal processing apparatus according to the second embodiment has substantially the same structure as that of the first embodiment. The difference is that the variable capacity unit 11 including a single variable capacity replaces the variable capacity unit 1 and only carrier Vp1 from the control circuit 8 is supplied to the one electrode of the variable capacity Cs1. Moreover, the control circuits 8 outputs the carrier Vp1 and the control signals a to f.

If a single variable capacitor Cs1 is used as the sensor and the initial charge is not cancelled, the initial charge in the variable capacitor Cs1 is superimposed on the output of the C-V converting circuit 2. Thus, the gain of the circuits after C-V converting could not be made high with the voltage signal processing. On the other hand, in the signal processing circuit according to the second embodiment, the output voltage of the C-V converting circuit 2 is held as charges and the offset components are removed by offset charges, so that the input signal can be amplified at a high gain.

<Thrid Embodiment>

Figure 7:
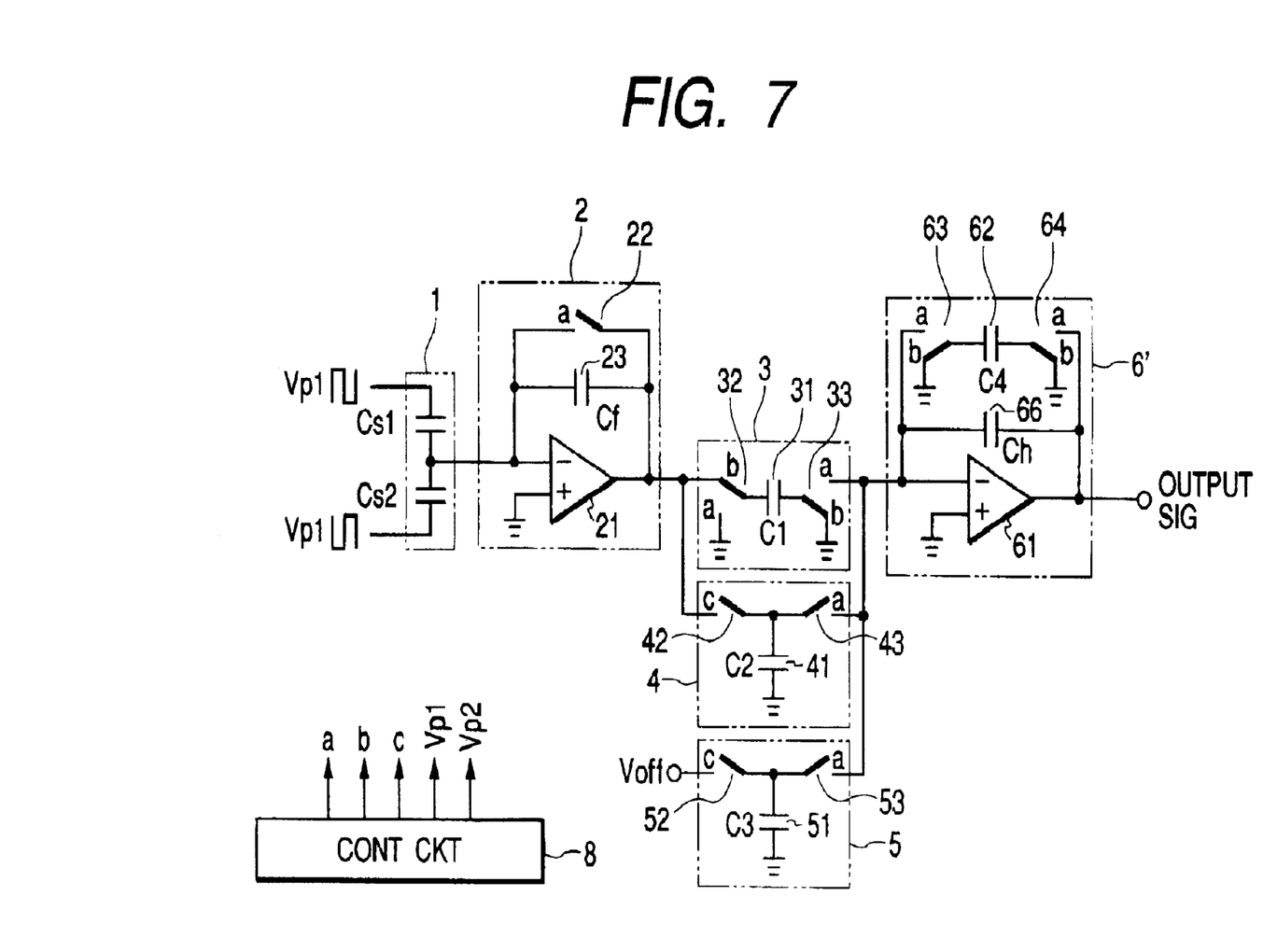
FIG. 7 is a schematic circuit diagram of a signal processing apparatus according to a third embodiment.

FIG. 7 shows a signal processing circuit according to a third embodiment. The signal processing circuit according to the third embodiment has substantially the same structure as that of the first embodiment. The difference is that the outputting circuit 7 is omitted and thus, the combined charge holding circuit 6' is modified to provide an outputting function to output the voltage corresponding to the physical amount. Thus, the combined charge holding circuit 6' includes the operational amplifier 61, a capacitor (C4) 62, the switches 63 and 64, and a capacitor (Ch) 66. The combined charge holding circuit 6' acts as a low-pass filter also. The switches 63 and 64 are controlled in response to the control signals a and b. The control circuit 8 generates the carriers Vp1 and Vp2 and the control signals a to c.

In the signal processing circuit of the third embodiment, disconnecting the combined charge holding circuit 6' from the outputting circuit by the switches 63 and 64 is not effected. Thus, if noise is developed during transferring charged from the first and second charge holding circuits 3 and 4 and the offset adjusting charge holding circuit 5, an error in the amount of the held charges may occur. However, this structure features a simple circuit structure because the number of operational amplifiers and other accompanied circuit elements is reduced.

Moreover, in this embodiment it is possible to use the single variable capacitor in the same manner as the second embodiment.

<Fourth Embodiment>

Figure 8:
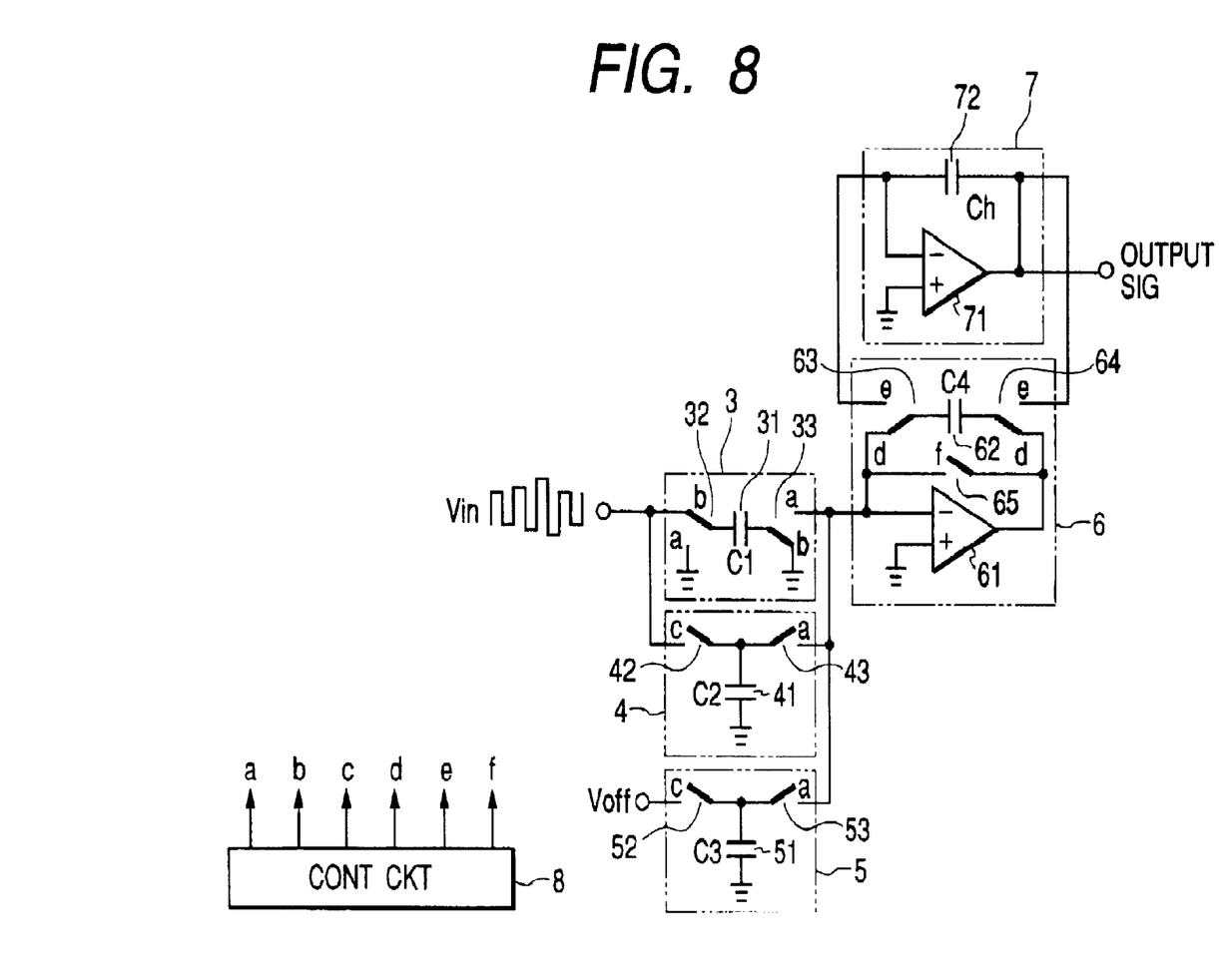
FIG. 8 is a schematic circuit diagram of a signal processing apparatus according to a fourth embodiment.

FIG. 8 shows a signal processing apparatus according to a fourth embodiment.

The signal processing apparatus according to the fourth embodiment has substantially the same structure as that of the first embodiment. The difference is that the differential variable capacity unit 1 and the C-V converting circuit 2 are omitted and an input signal is subjected to amplitude modulation at a predetermined frequency.

In the fourth embodiment, the signals processing circuit is provided not for detecting variation in capacity but for detecting a minute change in a resistance or inductance or the like. Thus, the input signal modulated as an ac signal is amplified and then demodulated into a dc signal. Moreover, if there is offset in the resistance or inductance or the like, the offset can be cancelled.

More specifically, as shown in FIG. 8, the signal processing circuit according to the fourth embodiment includes first and second charge holding circuits 3 and 4 for holding charges with correspondence to the modulated signal (input signal) Vin, an offset adjusting charge holding circuit 5 for holding charge for adjusting the offset in the input signal, a combined charge holding circuit 6, and an outputting circuit 7. The control circuit 8 outputs the control signals a to f.

According to the fourth embodiment, as the same as the first embodiment, the modulated signal is held as charges and the offset component is removed by operating charges, so that a high gain is provided.

The input signal is amplitude-modulated at the predetermined frequency and respective holding circuits 2 to 6 operate at the frequency. In other words, the input signal is amplitude-modulated at the frequency at which respective holding circuits 2 to 6 operate.

In this embodiment, it is possible to omit the outputting circuit 7 to obtain the output signal for the combined charge holding circuit 6 similarly to the second embodiment.

In the above-mentioned embodiment, if the offset is relatively low and if such a high gain that the output become saturated is not required, the offset adjusting charge holding can be omitted. That is, the offset adjusting charge holding circuits 5 in FIGS. 1, 3, 5, 7, and 8 can be occasionally omitted.

Moreover, if the charge stored in the first charge holding circuit 3 is stable, first charge holding circuit 3 can be omitted in place of the offset adjusting charge holding circuit 5. In this case, the offset adjusting charge holding circuit 5 holds the offset charges of the differential variable capacitor unit 1 and the C-V converting circuit 2.

Moreover, in the first and second embodiments, the first order LPF is formed with the combined charge holding circuit 6 and the outputting circuit 7 and in the third embodiment, the combined change holding circuit 6' forms a first order LPF. However, it is also possible that filtering is effected with other filter structure after combining charges.

In the above-mentioned embodiments, in the first and second charge holding circuits 3 and 5 and the offset adjusting charge holding circuit 5, one electrode or both electrodes are connected to a reference voltage (for example, the ground potential). Here, it is desired that the reference voltages of the charge hooding circuits are connected to a common terminal. This removes affection of the reference voltage at the charging circuits to the output signal. That is, it is important that the reference voltage terminal connected to the capacitors is common. This point is important in embodying this invention.

What is claimed is:

1. A signal processing apparatus comprising:

variable capacitor means of which capacity varies with a physical amount;

a C-V conversion circuit for converting variation in said capacity into a voltage signal;

first and second charge holding means for holding said voltage signal at different timings as first and second charges, respectively;

offset compensating charge holding means for generating and holding an offset charge for compensation of an offset in said voltage signal;

charge combining and holding means for combining and holding said first and second charges and said offset charge; and outputting means for receiving the combined charge from said charge combining and holding means and outputting an output voltage signal corresponding to said physical amount in accordance with the received charge.

2. A signal processing apparatus as claimed in claim 1, further comprising charge transferring means for transferring said first and second charges and said offset charge to said charge combining and holding means at the same time.

3. A signal processing apparatus as claimed in claim 2, wherein said charge transferring means comprises first, second and third switches for respectively and simultaneously transferring said first and second charges and said offset charge to said charge combining an holding means.

4. A signal processing apparatus as claimed in claim 1, wherein said first charge holding means holds said voltage signal as said first charge corresponding to an offset voltage of said C-V conversion circuit, said second charge holding means holds said voltage signal as said second charge representing variation in said capacity, and said charge combining and holding means holds said combined charge derived by subtracting said first charge and said offset charge from said second charge.

5. A signal processing apparatus as claimed in claim 1, wherein each of said first and second charge holding means comprises at least a first capacitor and first switching means for charging and discharging said first capacitor, said charge combining and holding means comprises a second capacitor for holding the combined charge, second switching means for charging and discharging the combined charge, and a first operational amplifier for converting said combined charge into a voltage, and said outputting means includes a third capacitor for receiving and holding the combined charge from said second capacitor and a second operational amplifier for converting the received charge from said third capacitor into said output voltage signal.

6. A signal processing apparatus as claimed in claim 5, wherein said second switching means switches between first and second states, in said first state, said second capacitor is connected between an output and a non-inverted input of said first operational amplifier, and in said second state, said second capacitor is connected in parallel to said third capacitor.

7. A signal processing apparatus as claimed in claim 5, wherein a capacitance of said first capacitor is greater than a capacitance of said second capacitor, and wherein amplification of said first operational amplifier is determined by a ratio of said capacitance of said first capacitor and said capacitance of said second capacitor.

8. A signal processing apparatus as claimed in claim 5, wherein said charge combining and holding means and said outputting means form a low-pass filter.

9. A signal processing apparatus as claimed in claim 1, wherein said charge combining and holding means and said converting and outputting means form a low-pass filter.

10. A signal processing apparatus as claimed in claim 1, wherein said variable capacitance comprises a differential variable capacitor unit including substantially equivalent capacitors connected in series.

11. A signal processing apparatus as claimed in claim 1, wherein said C-V conversion circuit comprises a switched capacitor circuit supplying said voltage signal to said first and second charge holding means.

12. A signal processing apparatus as claimed in claim 1, further comprising a control circuit for generating a carrier signal supplied to said variable capacitor means to output said voltage signal from said C-V conversion circuit and generating control signals supplied to said first and second charge holding means, said offset compensating charge holding means, and said charge combining and holding means.

13. A signal processing apparatus as claimed in claim 1, wherein said offset compensating charge holding means includes a memory for storing digital data corresponding to said offset and a d/a converter for d/a-converting said digital data to generate said offset charge.

14. A signal processing apparatus as claimed in claim 1, further comprising a first switch for supplying said voltage signal to said first charge holding means at a first time interval and a second switch for supplying said voltage signal to said second charge holding means at a second time interval.

15. A signal processing apparatus as claimed in claim 1, wherein said C-V conversion circuit includes an operational amplifier having an input responsive to an output of said variable capacitor means and an output for outputting said voltage signal.

16. A signal processing apparatus as claimed in claim 1, wherein said offset compensating charge holding means adjustably generates said offset charge.

17. A signal processing apparatus as claimed in claim 1, further comprising a variable voltage source for generating said offset charge.

18. A signal processing apparatus as claimed in claim 1, wherein said variable capacitor means has an offset and thereby said first and second charge holding means hold offset component charges due to said offset, said charge combining and holding means combines said first and second charges and said offset charge such that said offset component charges are cancelled with said offset charge from said offset compensating charge holding means.

19. A signal processing apparatus comprising:

variable capacitor means of which capacity varies with a physical amount;

a C-V conversion circuit for converting variation in said capacity into a voltage signal;

first and second charge holding means for holding said voltage signal at different timings as first and second charges, respectively;

offset compensating charge holding means for generating holding an offset charge for compensation of an offset in said voltage signal; and charge combining and holding means for combining and holding said first and second charges and said offset charge as the combined charge and converting the combined charge into an output voltage signal indicative of said physical amount.

20. A signal processing apparatus as claimed in claim 19, further comprising charge transferring means for transferring said first and second charges and said offset charge to said charge combining means at the same time.

21. A signal processing apparatus as claimed in claim 20, wherein said charge transferring means comprises first, second and third switches for respectively and simultaneously transferring said first and second charges and said offset charge to said charge combining an holding means.

22. A signal processing apparatus as claimed in claim 19, wherein said first charge holding means holds said voltage signal as said first charge corresponding to an offset voltage of said C-V conversion circuit, said second charge holding means holds as said second charge representing variation in said capacity, said charge combining and holding means holds said combined charge derived by subtracting first charge and said offset charge from said second charge.

23. A signal processing apparatus as claimed in claim 19, wherein each of said first and second charge holding means comprises at least a first capacitor and switching means for charging and discharging said first capacitor and said charge combining and holding means comprises a second capacitor for holding the combined charge, switching means for charging and discharging the combined charge, and an operational amplifier for converting said combined charge into said output voltage signal.

24. A signal processing apparatus as claimed in claim 23, wherein a capacitance of said first capacitor is greater than a capacitance of said second capacitor, and wherein amplification of said first operational amplifier is determined by a ratio of said capacitance of said first capacitor and said capacitance of said second capacitor.

25. A signal processing apparatus as claimed in claim 23, wherein said charge combining and holding means includes a low-pass filter means.

26. A signal processing apparatus as claimed in claim 19, wherein said charge combining and holding means includes a low-pass filter means.

27. A signal processing apparatus as claimed in claim 19, wherein said variable capacitor means comprises a differential variable capacitor unit including substantially equivalent capacitances connected in series.

28. A signal processing apparatus as claimed in claim 19, wherein said C-V conversion circuit comprises a switched capacitor circuit supplying said voltage signal to said first and second charge holding means.

29. A signal processing apparatus as claimed in claim 19, further comprising a control circuit for generating a carrier signal supplied to said variable capacitor means to output said voltage signal from said C-V conversion circuit and generating control signals supplied to said first and second charge holding means, said offset compensating charge holding means, and said charge combining and holding means.

30. A signal processing apparatus as claimed in claim 19, wherein said offset compensating charge holding means includes a memory for storing digital data corresponding to said offset, and a d/a converter for d/a-converting said digital data to generate said offset charge.

31. A signal processing apparatus as claimed in claim 19, further comprising a first switch for supplying said voltage signal to said first charge holding means at a first time interval and a second switch for supplying said voltage signal to said second charge holding means at a second time interval.

32. A signal processing apparatus as claimed in claim 19, wherein said C-V conversion circuit includes an operational amplifier having an input responsive to an output of said variable capacitor means and an output for outputting said voltage signal.

33. A signal processing apparatus as claimed in claim 19, wherein said offset compensating charge holding means adjustably generates said offset charge.

34. A signal processing apparatus as claimed in claim 19, further comprising a variable voltage source for generating said offset charge.

35. A signal processing apparatus as claimed in claim 19, wherein said variable capacitor means has an offset and thereby said first and second charge holding means hold offset component charges due to said offset, said charge combining and holding means combines said first and second charges and said offset charge such that said offset component charges are cancelled with said offset charge from said offset compensating charge holding means.

36. A signal processing apparatus comprising:
   variable capacitor means of which capacity varies with a physical amount;
   a C-V conversion circuit for converting variation in said capacity into a voltage signal;
   first and second charge holding means for holding said voltage signal at different timings as first and second charges, respectively;
   charge combining and holding means for combining and holding said first and second amounts of charges; and
   outputting means for receiving the combined charge and outputting an output voltage signal in accordance with the received charge corresponding to said physical amount.

37. A signal processing apparatus as claimed in claim 36, further comprising charge transferring means for transferring said first and second charges to said charge combining means at the same time.

38. A signal processing apparatus as claimed in claim 37, wherein said charge transferring means comprises first, second and third switches for respectively and simultaneously transferring said first and second charges and said offset charge to said charge combining an holding means.

39. A signal processing apparatus as claimed in claim 36, wherein said first charge holding means holds said voltage signal as said first charge corresponding to an offset voltage of said C-V conversion circuit, said second charge holding means holds said voltage signal as said second charge representing variation in said capacity, and said charge combining and holding means holds said combined charge derived by subtracting first charge from said second charge.

40. A signal processing apparatus as claimed in claim 36, wherein each of said first and second charge holding means comprises at least a first capacitor and first switching means for charging and discharging said first capacitor, said charge combining and holding means comprises a second capacitor for holding the combined charge, second switching means for charging and discharging the combined charge, and a first operational amplifier for converting said combined charge into a voltage, and said outputting means includes a third capacitor for receiving and holding the combined charge from said second capacitor and a second operational amplifier for converting said combined charge from said third capacitor into said output voltage signal.

41. A signal processing apparatus as claimed in claim 40, wherein said second switching means switches between first and second states, in said first state, said second capacitor is connected between an output and a non-inverted input of said first operational amplifier, and in said second state, said second capacitor is connected in parallel to said third capacitor.

42. A signal processing apparatus as claimed in claim 40, wherein a capacitance of said first capacitor is greater than a capacitance of said second capacitor, and wherein amplification of said first operational amplifier is determined by a ratio of said capacitance of said first capacitor and said capacitance of said second capacitor.

43. A signal processing apparatus as claimed in claim 40, wherein said charge combining and holding means and said outputting means form a low-pass filter.

44. A signal processing apparatus as claimed in claim 36, wherein said charge combining and holding means and said outputting means form a low-pass filter.

45. A signal processing apparatus as claimed in claim 36, wherein said variable capacitor means comprises a differential variable capacitor unit including substantially equivalent capacitances connected in series.

46. A signal processing apparatus as claimed in claim 36, wherein said C-V conversion circuit comprises a switched capacitor circuit supplying said voltage signal to said first and second charge holding means.

47. A signal processing apparatus as claimed in claim 36, further comprising a control circuit for generating a carrier signal supplied to said variable capacitance to output said voltage signal from said C-V conversion circuit and generating control signals supplied to said first and second charge holding means, and said charge combining and holding means.

48. A signal processing apparatus as claimed in claim 36, further comprising a first switch for supplying said voltage signal to said first charge holding means at a first time interval and a second switch for supplying said voltage signal to said second charge holding means at a second time interval.

49. A signal processing apparatus as claimed in claim 36, wherein said C-V conversion circuit includes an operational amplifier having an input responsive to an output of said variable capacitor means and an output for outputting said voltage signal.

50. A signal processing apparatus comprising:
variable capacitor means of which capacity varies with a physical amount;
a C-V conversion circuit for converting variation in said capacity into a voltage signal;
first and second charge holding means for holding said voltage signal at different timings as first and second charges, respectively; and
charge combining and holding means for combining and holding said first and second charges and converting a combined charge into an output voltage signal corresponding to said physical amount.

51. A signal processing apparatus as claimed in claim 50, further comprising charge transferring means for transferring said first and second charges to said converting means at the same time.

52. A signal processing apparatus as claimed in claim 51, wherein said charge transferring means comprises first, second and third switches for respectively and simultaneously transferring said first and second charges and said offset charge to said charge combining an holding means.

53. A signal processing apparatus as claimed in claim 50, wherein said first charge holding means holds said voltage signal as said first charge corresponding to an offset voltage of said C-V conversion circuit, said second charge holding means holds said voltage signal as said second charge representing variation in said capacity, and said charge combining and holding means holds said combined charge derived by subtracting first charge from said second charge.

54. A signal processing apparatus as claimed in claim 50, wherein each of said first and second charge holding means comprises at least a first capacitor and switching means for charging and discharging said first capacitor and said charge combining and holding means comprises a second capacitor for holding the combined charge, switching means for charging and discharging the combined charge, and an operational amplifier for converting said combined charge into said output voltage signal.

55. A signal processing apparatus as claimed in claim 54, wherein a capacitance of said first capacitor is greater than a capacitance of said second capacitor, wherein amplification of said first operational amplifier is determined by a ratio of said capacitance of said first capacitor and said capacitance of said second capacitor.

56. A signal processing apparatus as claimed in claim 54, wherein said charge combining and holding means includes a low-pass filter means.

57. A signal processing apparatus as claimed in claim 50, wherein said charge combining and holding means includes a low-pass filter means.

58. A signal processing apparatus as claimed in claim 50, wherein said variable capacitor means comprises a differential variable capacitor unit including substantially equivalent capacitances connected in series.

59. A signal processing apparatus as claimed in claim 50, wherein said C-V conversion circuit comprises a switched capacitor circuit supplying said voltage signal to said first and second charge holding means.

60. A signal processing apparatus as claimed in claim 50, further comprising a control circuit for generating a carrier signal supplied to said variable capacitor means to output said voltage signal from said C-V conversion circuit and generating control signals supplied to said first and second charge holding means, and said charge combining and holding means.

61. A signal processing apparatus as claimed in claim 50, further comprising a first switch for supplying said voltage signal to said first charge holding means at a first time interval and a second switch for supplying said voltage signal to said second charge holding means at a second time interval.

62. A signal processing apparatus as claimed in claim 50, wherein said C-V conversion circuit includes an operational amplifier having an input responsive to an output of said variable capacitor means and an output for outputting said voltage signal.

63. A signal processing apparatus comprising:
first and second charge holding means for holding an input signal as first and second charges at different timings, respectively;
offset compensating charge holding means for generating and holding an offset charge;
charge combining and holding means for combining and holding said first and second charges and said offset charge; and
outputting means for receiving the combined charge and outputting a voltage corresponding to said input signal in accordance with the received charge.

64. A signal processing apparatus as claimed in claim 63, wherein said input signal is subjected to amplitude modulation at a predetermined frequency and said first and second charge holding means, said offset compensating charge holding means, and said charge combining and holding means operate at said predetermined frequency.

65. A signal processing apparatus as claimed in claim 63, wherein said offset compensating charge holding means includes a memory for storing digital data corresponding to said offset, and a d/a converter for d/a-converting said digital data to generate said offset charge.

66. A signal processing apparatus comprising:
first and second charge holding means for holding an input signal at different timings as first and second charges, respectively;
offset compensating charge holding means for generating and holding an offset charge; and
charge combining and holding means for combining and holding said first and second charges and said offset charge as a combined charge and converting said combined charge into an output voltage corresponding to said input signal.

67. A signal processing apparatus as claimed in claim 66, wherein said input signal is subjected to amplitude modulation at a predetermined frequency and said first and second charge holding means, said offset compensating charge holding means, and said charge combining and holding means operate at said predetermined frequency.

68. A signal processing apparatus as claimed in claim 66, wherein said offset compensating charge holding means includes a memory for storing digital data corresponding to said offset and a d/a converter for d/a-converting said digital data to generate said offset charge.

69. A signal processing apparatus comprising:

first and second charge holding means for holding an input signal as first and second charges at different timings, respectively;

charge combining and holding means for combining and holding said first and second charges; and outputting means for receiving the combined charge and outputting a voltage corresponding to said input signal in accordance with the received charge.

70. A signal processing apparatus as claimed in claim 69, wherein said input signal is subjected to amplitude modulation at a predetermined frequency and said first and second charge holding means and said charge combining and holding means operate at said predetermined frequency.

71. A signal processing apparatus comprising:

first and second charge holding means for holding an input signal at different timings as first and second charges, respectively; and charge combining and holding means for combining and holding said first and second charges and said offset charge as a combined charge, wherein said charge combining and holding means converts said combined charge into an output voltage corresponding to said input signal.

72. A signal processing apparatus as claimed in claim 71, wherein said input signal is subjected to amplitude modulation at a predetermined frequency and said first and second charge holding means and said charge combining and holding means operate at said predetermined frequency.

73. A signal processing apparatus comprising:

variable capacitor means of which capacity varies with a physical amount;

a C-V conversion circuit for converting variation in said capacity into a voltage signal;

at least a charge holding means for holding said voltage signal as a charge;

offset compensating charge holding means for generating and holding an offset charge for compensation of an offset in said voltage signal;

outputting means for combining and converting said charge and said offset charge to output a voltage signal corresponding to said physical amount.

74. A signal processing apparatus as claimed in claim 73, wherein said outputting means comprises:

charge combining and holding means for combining and holding said charge and said offset charge; and converting and outputting means for receiving and converting a combined charge from said charge combining and holding means into said output voltage signal.

75. A signal processing apparatus as claimed in claim 73, wherein said outputting means comprises charge combining and holding means for combining and holding said charge and said offset charge and converting the combined charge into said output voltage signal.

76. A signal processing apparatus as claimed in claim 73, further comprising a first switch for supplying said voltage signal to said first charge holding means at a first time interval and a second switch for supplying said voltage signal to said second charge holding means at a second time interval.

77. A signal processing apparatus as claimed in claim 73, wherein said C-V conversion circuit includes an operational amplifier having an input responsive to an output of said variable capacitor means and an output for outputting said voltage signal.

78. A signal processing apparatus comprising:

at least a charge holding means for holding an input voltage signal as a charge, said input voltage signal being modulated at a predetermined frequency;

offset compensating charge holding means for generating and holding an offset charge for compensation of an offset in said voltage signal;

outputting means for combining and converting said charge and said offset charge to output a voltage signal corresponding to said input voltage signal.

79. A signal processing apparatus as claimed in claim 78, wherein said outputting means comprises:

charge combining and holding means for combining and holding said charge and said offset charge; and converting and outputting means for receiving and converting the combined charge from said charge combining and holding means into said output voltage signal.

80. A signal processing apparatus as claimed in claim 78, wherein said outputting means comprises charge combining and holding means for combining and holding said charge and said offset charge and converting the combined charge into said output voltage signal.

* * * * *